United States Patent [19]

Fuse et al.

[11] 4,358,478

[45] Nov. 9, 1982

[54] SPUTTERING METHOD OF MANUFACTURING FILM TYPE LIGHT RECEIVING ELEMENT UNDER CONTROLLED OXYGEN ATMOSPHERE

[75] Inventors: Mario Fuse; Mutsuo Takenouchi, both of Kanagawa, Japan

[73] Assignee: Fuji Xerox Co., Ltd., Tokyo, Japan

[21] Appl. No.: 242,736

[22] Filed: Mar. 11, 1981

[30] Foreign Application Priority Data

Mar. 14, 1980 [JP] Japan ................................. 55/31516

[51] Int. Cl.³ ........................................... H01L 27/14
[52] U.S. Cl. ................................. 427/76; 427/126.2; 427/87; 427/89; 428/623; 428/635; 428/636; 428/642; 357/30; 430/128; 427/255.3
[58] Field of Search ................. 427/76, 126.2, 89, 87, 427/248 C; 357/29, 30, 90; 428/623, 635, 636, 642

[56] References Cited

U.S. PATENT DOCUMENTS

| | | | |
|---|---|---|---|
| 4,214,253 | 7/1980 | Hall | 357/29 |
| 4,234,625 | 11/1980 | Petrov et al. | 427/87 |
| 4,255,686 | 3/1981 | Marugama | 313/366 |

*Primary Examiner*—John D. Welsh
*Attorney, Agent, or Firm*—Sughrue, Mion, Zinn, Macpeak & Seas

[57] ABSTRACT

A method of manufacturing a film type light receiving element in which the electric current ratio for light and dark input intensities is maximized. Metal electrodes and a photoconductive film are provided in the form of belt-shaped layers on a flat smooth substrate such as a quartz layer. An optically transmissive electrode film of a tin oxide compound is formed thereon in a magnetron type sputtering device. Utilizing the fact that the electric current ratio for light and dark input intensities of the light receiving element varies according to the oxygen partial pressure of the sputtering atmosphere in the sputtering device, the oxygen partial pressure is set close to a value at which the electric current ratio for light and dark input intensities is at a peak value.

20 Claims, 5 Drawing Figures

SPUTTERING METHOD OF MANUFACTURING FILM TYPE LIGHT RECEIVING ELEMENT UNDER CONTROLLED OXYGEN ATMOSPHERE

BACKGROUND OF THE INVENTION

The present invention relates to a method of manufacturing a photoconductive film type light receiving element for converting data on ordinary clerical documents into electrical signals in time-series and a product produced by this method.

More particularly, the invention relates to a method of manufacturing a film type light receiving element in which a photoconductive non-crystalline film is formed, for instance, by vacuum evaporation on a flat and smooth insulating substrate on which belt-shaped electrodes are arranged in a desired density and in which an optically transmissive electrode is formed on predetermined parts of the belt-shaped electrodes. A film of Au or the like is used for each of the belt-shaped electrodes, an Se-As-Te film is used for the photoconductive non-crystalline film, and an InSn oxide film (hereinafter referred to as "an ITO film") or an Sn oxide film which is obtained by sputtering under an argon pressure of $3 \times 10^{-3}$ to $4 \times 10^{-3}$ Torr and an oxygen pressure of $1.8 \times 10^{-4}$ to $3 \times 10^{-4}$ Torr with a compound $In_2O_3$- $SnO_2$ or $SnO_2$ as a target.

FIG. 1 is a sectional view showing the structure of a conventional film type light receiving element. Belt-shaped electrodes 2, a photoconductive film 3 and an optically transmissive electrode 4 are formed on a flat and smooth substrate 1 in the stated order. For instance, the substrate 1 is made of a highly insulative material such as quartz glass or Vycor TM brand glass, the belt-shaped electrodes are formed of an Au film, the photoconductive film 3 is an Se-As-Te film or a CdSe film, and the optically transmissive electrode 4 is an InSn oxide film or an Sn oxide film.

In FIG. 2, the curve I indicates specific resistance $\rho$ with oxygen partial pressure $P_o$ in a sputtering atmosphere for the case where an ITO film is formed on a glass substrate with a magnetron type sputtering device using an ITO target.

By forming on a flat and smooth substrate of Pyrex TM glass the belt-shaped electrodes, i.e. the Au films 2, the photoconductive film, i.e. the Se-As-Te film 3, and the optically transmissive electrode, i.e. the $SnO_2$ film 4 in the stated order, a light receiving element having a structure as shown in FIG. 1 is obtained.

Heretofore, the electrical conductivity and the transmissively of the optical transmissive electrode have been considered as important factors. It has previously been considered impossible to increase the electric current ratio for light and dark intensities which is the most important factor of the photoelectric conversion element.

Accordingly, an object of the invention is to provide a method of manufacturing a film type light receiving element in which the above-described difficulty accompanying the conventional method is eliminated and the electric current ratio for light and dark intensities is increased.

SUMMARY OF THE INVENTION

In accordance with this and other objects of the invention, there is provided a method of manufacturing a film type light receiving element in which metal electrodes and a photoconductive film are provided in the form of layers on a flat smooth substrate such as a substrate of quartz having an optically polished surface and an optically transmissive electrode film of a tin oxide compound is formed thereon in a magnetron type sputtering device. In accordance with the invention, the electric current ratio for light and dark input optical intensities of the light receiving element is made to have a peak value by setting the oxygen partial pressure in a vacuum chamber of the magnetron type sputtering device in the vicinity of a value at which the electric current ratio for light and dark input intensities is at a peak value.

DESCRIPTION OF THE PREFERRED EMBODIMENTS

Figure 1:
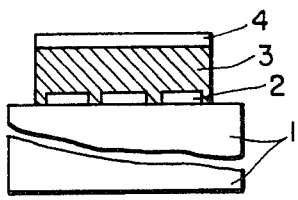
FIG. 1 is an explanatory diagram showing a sectional structure of a conventional film type light receiving element.

The structure of a film type light receiving element which is manufactured according to a preferred embodiment of a film type light receiving element manufacturing method of the invention will now be described. The structure of the light receiving element manufactured in accordance with the invention is the same in section as the conventional film type light receiving element shown in FIG. 1.

The substrate 1 is formed of an insulating glass or ceramic material which has a high surface smoothness, the belt-shaped electrodes 2 are an Au film with a Cr base, the photoconductive film 3 is an Se-As-Te series film, and the optically transmissive film 4 is an ITO film $(xIn_2O_3 + (1-x)SnO_2)$ which is formed with a magnetron type sputtering device using a 90% $In_2O_3$ - 10% $SnO_2$ target.

The photoelectric conversion characteristic of the film type light receiving element having the above-described structure depends on the quality of material of each layer and the quality of each film. Especially the interface between the belt-shaped electrodes 2 and the photoconductive Se-As-Te film 3 and the junction interface between the Se-As-Te film 3 and the optically transmissive ITO film greatly affects the electric current ratio for light and dark input intensities.

The Se-As-Te film 3 is a p type photoelectric element. Therefore, it is desirable that the light receiving element be operated with the belt-shaped Cr-Au electrode 2 as the negative electrode and with the optically transmissive ITO film as the positive electrode. In this connection, it is preferable that the material of the negative electrode be Au which has a low electron injection property, while the material of the positive electrode is an n type ITO film which has a low Hall injection property.

An important factor in manufacturing the ITO film is to use a magnetron type sputtering device with which the temperature of the substrate is increased very little and the Se-Te-As film is not crystallized.

Figure 2:
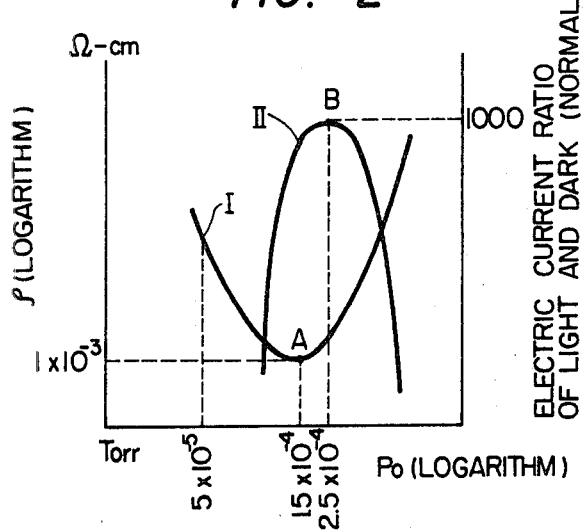
FIg. 2 is a graphical representation indicating oxygen partial pressure with sputtered ITO film specific resistance and oxygen partial pressure with electric current ratio for light and dark input intensities.

As is apparent from the curve I in FIG. 2, the point A at which the specific resistance $\rho$ is a minimum corresponds to a specific resistance of $2\times10^{-1}$ $\Omega$-cm and an oxygen partial pressure of $1.8\times10^{-4}$ Torr. In this case, the gaseous pressure of a mixture of argon and oxygen is $3.5\times10^{-3}$ Torr. Therefore, if it is desired to minimize the electrical conductivity, an optically transmissive electrode of lowest resistance can be obtained by forming the electrode under the sputtering conditions defined by the point A.

The curve II in FIG. 2 indicates the electric current ratio for light and dark input intensities with sputtering atmosphere oxygen partial pressure. In FIG. 2, the point B indicates the oxygen partial pressure with which the electric current ratio of light and dark is maximum. More specifically, the point B corresponds to an oxygen partial pressure of $2.5\times10^{-4}$ Torr and an electric current ratio for light to dark of 1000. As is seen from FIG. 2, the oxygen partial pressure at the point B is not coincident with that at the point A.

Figure 3:
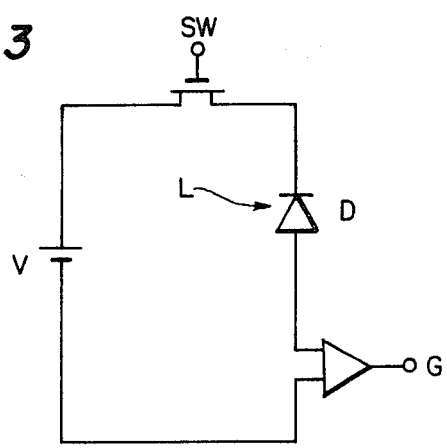
FIG. 3 is a circuit diagram showing an example of a drive circuit for driving a film type light receiving element.
Figure 4:
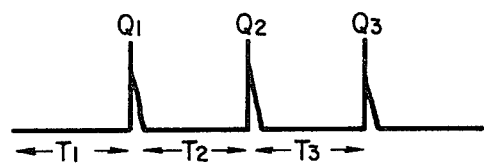
FIG. 4 is a diagram showing an example of an output signal which provided when the film type light receiving element is operated in an accumulation mode.

If the above-described light receiving element is operated in an accumulation type photoelectric conversion system with a circuit as shown in FIG. 3, a signal as shown in FIG. 4 is produced.

FIG. 3 shows a series circuit having a voltage source V, a switch SW, a diode D and an output at G. The diode D receiving light L is the light receiving element in accordance with this invention. The circuit of FIG. 3 is operated conventionally in a switch mode where the diode D is scanned as a part of an array of devices to produce an output having an electric current ratio for light and dark intensities.

Also, if a number of circuits as shown in FIG. 3 are arranged in a row, a one-dimensional sensor can be provided.

A light receiving element which is manufactured by forming an optically transmissive ITO film using a 90% $In_2O_3$-10% $SnO_2$ target under an oxygen partial pressure of $18.8\times10^{-4}$ to $3\times10^{-4}$ Torr and a gaseous pressure of $3.5\times10^{-3}$ Torr of a mixture of argon and oxygen according to the manufacturing method of the invention on a Se-Te-As photoconductive film 3 which is formed on an Au belt-shaped electrodes 2 as described above has a considerably high electrical current ratio for light and dark input intensities.

Specific examples of the invention will now be described.

EXAMPLE 1

In manufacturing a film type light receiving element having a structure as shown in FIG. 1, a substrate 1 was made of a quartz glass the surface of which was optically polished. Au films 800 Å in thickness were formed on chromium bases 700 Å in thickness to provide the belt-shaped electrodes 2. Then, a layer of 5% As - 95% Se was formed on the belt-shaped electrodes 2 to a thickness of 2 $\mu$m. Thereafter, a layer of 5% As - 20% Te - 75% Se was formed on the aforementioned layer to a thickness of 0.3 $\mu$m and then a layer of 5% As - 95% Se was formed thereon to a thickness of 400 Å to provide the photoconductive film 3, thereby to fabricate a preliminary element.

Then, in order to make the size of the light receiving section 100 $\mu$m × 100 $\mu$m, a mask for the optically transmissive electrode was placed on the element and the element with the mask was placed in a magnetron type sputtering device. A 90% $In_2O_3$ - 10% $SnO_2$ sintered body was used as the target.

After the pressure in the vacuum chamber was reduced to lower than $2\times10^{-5}$ Torr, oxygen was introduced thereinto until the pressure therein increased to $2.5\times10^{-4}$ Torr. After the pressure was stabilized, argon was supplied into the vacuum chamber until the pressure therein was $3.5\times10^{-3}$ Torr. After pre-sputtering was carried out for a suitable period of time, an ITO film 4 was formed on the Se-Te-As film 3 to a thickness of about 1500 Å.

The ITO film 4 thus formed, having a transmissivity of smaller than 75% and a sheet resistance of lower than 1 K$\Omega$, satisfied the requirements for the light receiving element. The light receiving element fabricated with the above-described process had an electric current ratio for light and dark of 500 and an optical sensitivity of 10 Pa/lux. Thus, the light receiving element had much more excellent reproducibility and electric current ratio for light and dark characteristics than an element fabricated according to the conventional manufacturing method. In this connection, although the film thickness of the optically transmissive electrode 4 was varied in a range of from 500 Å to 5000 Å with the oxygen partial pressure set to $2\times10^{-4}$ Torr, excellent results were obtained similarly.

EXAMPLE 2

During the sputtering of the transparent electrode layer, instead of the 90% $In_2O_3$ - 10% $SnO_2$ sintered body used in Example 1, an $SnO_2$ sintered body was used.

The manufacturing procedure in Example 2 was the same as that in Example 1 except for the following. The pressure in the vacuum chamber of the sputtering device was set to about $10^{-7}$ Torr before oxygen was introduced thereinto. The oxygen partial pressure of the sputtering atmosphere was set to $2\times10^{-4}$ Torr. The thickness of the $SnO_2$ film used as the optically transmissive electrode film was set to 1000 Å.

Figure 5:
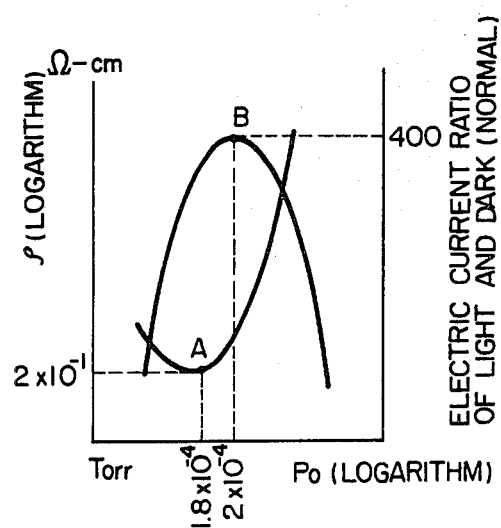
FIG. 5 is a graphical representation indicating oxygen partial pressure with sputtered $SnO_2$ film specific resistance and oxygen partial pressure with electric current ratio for light and dark input intensities.

The above-described various values were determined according to the relations between the oxygen partial pressure $P_o$ and $SnO_2$ transmissive film specific resistance $\rho$ and between the electric current ratio for light and dark input intensities as shown in FIG. 5.

The $SnO_2$ film produced in Example 2 had an optical transmissivity of greater than 80% and a sheet resistance of lower than 100 K$\Omega$, thus satisfying the requirements as the light receiving element. The electric current ratio for light and dark and the optical sensitivity of the light receiving element were 400 and more than 10 Pa/lux. Thus, the light receiving element of the invention as produced by the process of Example 2 had excellent reproducibility and electric current ratio for light and dark characteristics as compared to an element manufactured according to the conventional method. In addition, excellent results were similarly obtained when the film thickness of the optically transmissive electrode 4 was varied in a range of from 500 Å to 5000 Å under an oxygen partial pressure of $2\times10^{-4}$ Torr.

What is claimed is:

1. A method of manufacturing a film type light receiving element comprising the steps of: providing an insulating substrate having a substantially smooth surface; forming belt-shaped metal electrodes on said smooth surface of said substrate; forming a photoconductive film over said metal electrodes and portions of said surface of said substrate; and forming an optically transmissive electrode film of tin oxide upon said photoconductive film by magnetron sputtering, said sputtering being carried out in an atmosphere having an oxygen partial pressure at a value such that an electric current ratio for light and dark input intensities is at a peak value.

2. The method of claim 1 wherein said photoconductive film comprises a Se-As-Te film.

3. The method of claim 1 wherein said step of forming said belt-shaped electrodes comprises depositing a Cr base layer and depositing an Au film upon said Cr base layer.

4. The method of claim 1 wherein said tin oxide film comprises an ITO film.

5. The method of claim 4 wherein said step of forming said optically transmissive electrode film comprises sputtering using a 90% $In_2O_3$ - 10% $SnO_2$ target.

6. The method of claim 1 wherein said step of forming said optically transmissive electrode film comprises sputtering wherein the temperature of said substrate is not substantially raised above the ambient.

7. The method of claim 1 wherein said step of forming said optically transmissive electrode film comprises sputtering in an atmosphere having an oxygen partial pressure of $1.8 \times 10^{-4}$ Torr.

8. The method of claim 6 wherein said atmosphere comprises a mixture of argon and oxygen at a pressure of $3.5 \times 10^{-3}$ Torr.

9. A method of manufacturing a film type light receiving element comprising the steps of: providing a substrate of quartz glass having an optically polished surface; forming belt-shaped electrodes by forming a chromium base layer in a belt-shape to a thickness of approximately 700 Å and an Au film upon said chromium base; forming a layer of 5% As - 95% Se upon said belt-shaped electrode to a thickness of 2 μm; forming a layer of 5% As - 20% Te - 75% Se upon the last-mentioned layer to a thickness of approximately 0.3 μm; forming a layer of 5% As - 95% Se on the last-mentioned layer to a thickness of approximately 400 Å; masking the device thus formed for producing an optically transmissive electrode; disposing the element thus formed in a magnetron type sputtering device using a 90% $In_2O_3$ - 10% $SnO_2$ sintered body as a target; providing a pressure in a vacuum chamber of said magnetron type sputtering device in which said element is disposed of no greater than $2 \times 10^{-5}$ Torr; introducing oxygen into said chamber until the pressure therein is increased to approximately $2.5 \times 10^{-4}$ Torr; introducing argon into said chamber until the pressure therein is approximately $3.5 \times 10^{-3}$ Torr; pre-sputtering said element in said sputtering device; and forming an ITO film to a thickness in the range of 500 Å to 5000 Å.

10. A method of manufacturing a film type light receiving element comprising the steps of: providing a substrate of quartz glass having an optically polished surface; forming belt-shaped electrodes by forming a chromium base layer in a belt-shape to a thickness of approximately 700 Å and an Au film upon said chromium base; forming a layer of 5% As - 95% Se upon said belt-shaped electrode to a thickness of 2 μm; forming a layer of 5% As - 20% Te - 75% Se upon the last-mentioned layer to a thickness of approximately 0.3 μm; forming a layer of 5% As - 95% Se on the last-mentioned layer to a thickness of approximately 400 Å; masking the device thus formed for producing an optically transmissive electrode; disposing the element thus formed in a magnetron type sputtering device using an $SnO_2$ sintered body as a target; providing a pressure in a vacuum chamber of said magnetron type sputtering device in which said element is disposed of no greater than $10^{-7}$ Torr; introducing oxygen into said chamber until the pressure therein is increased to approximately $2 \times 10^{-4}$ Torr; introducing argon into said chamber until the pressure therein is approximately $3.5 \times 10^{-3}$ Torr; pre-sputtering said element in said sputtering device; and forming an ITO film to a thickness in the range of 500 Å to 5000 Å.

11. A film type light receiving element comprising: an insulating substrate having a substantially smooth surface; belt-shaped metal electrodes formed on said smooth surface of said substrate; a photoconductive film disposed over said metal electrodes and portions of said surface of said substrate; and, an optically transmissive electrode film of tin oxide formed upon said photoconductive film by magnetron sputtering, said sputtering of said tin oxide being carried out in an atmosphere having an oxygen partial pressure at a value each that an electric current ratio for light and dark input intensities is at a peak value.

12. The light receiving element of claim 11 wherein said photoconductive film comprises a Se-As-Te film.

13. The light receiving element of claim 11 wherein said belt-shaped electrodes comprises a Cr base layer and an Au film upon said Cr base layer.

14. The light receiving element of claim 11 wherein said tin oxide film comprises an ITO film.

15. The light receiving element of claim 14 wherein said optically transmissive electrode film is formed by sputtering using a 90% $In_2O_3$ - 10% $SnO_2$ target.

16. The light receiving element of claim 11 wherein said optically transmissive electrode film is formed by sputtering wherein the temperature of said substrate is not substantially raised above the ambient.

17. The light receiving element of claim 11 wherein said said optically transmissive electrode film is formed by sputtering in an atmosphere having an oxygen partial pressure of $1.8 \times 10^{-4}$ Torr.

18. The light receiving element of claim 16 wherein said atmosphere comprises a mixture of argon and oxygen at a pressure of $3.5 \times 10^{-3}$ Torr.

19. A film type light receiving element comprising: a substrate of quartz glass having an optically polished surface; belt-shaped electrodes having a chromium base layer in a belt-shape at a thickness of approximately 700 Å and an Au film upon said chromium base; a layer of 5% As - 95% Se upon said belt-shaped electrode at a thickness of 2 μm; a layer of 5% As - 20% Te - 75% Se upon the last-mentioned layer at a thickness of approximately 0.3 μm; a layer of 5% As - 95% Se on the last-mentioned layer at a thickness of approximately 400 Å; and, an optically transmissive electrode formed by masking the device thus formed and disposing the element in a magnetron type sputtering device using a 90% $In_2O_3$ -10% $SnO_2$ sintered body as a target, providing a pressure in a vacuum chamber of said magnetron type sputtering device in which said element is disposed of no greater than $2 \times 10^{-5}$ Torr, introducing oxygen into said chamber until the pressure therein is increased to approximately $2.5 \times 10^{-4}$ Torr, introducing argon into said chamber until the pressure therein is approximately $3.5 \times 10^{-3}$ Torr, pre-sputtering said element in said sputtering device, and forming an ITO film to a thickness in the range of 500 Å to 5000 Å.

20. A film type light receiving element comprising: a substrate of quartz glass having an optically polished surface; belt-shaped electrodes having a chromium base layer in a belt-shape at a thickness of approximately 700 Å and an Au film upon said chromium base; a layer of 5% As - 95% Se upon said belt-shaped electrode at a thickness of 2 μm; a layer of 5% As - 20% Te - 75% Se upon the last-mentioned layer at a thickness of approximately 0.3 μm; a layer of 5% As - 95% Se on the last-mentioned layer at a thickness of approximately 400 Å; and, an optically transmissive electrode; formed by masking the device thus formed and and disposing the element in a magnetron type sputtering device using an $SnO_2$ sintered body as a target, providing a pressure in a vacuum chamber of said magnetron type sputtering device in which said element is disposed of no greater than $10^{-7}$ Torr, introducing oxygen into said chamber until the pressure therein is increased to approximately $2 \times 10^{-4}$ Torr, introducing argon into said chamber until the pressure therein is approximately $3.5 \times 10^{-3}$ Torr, pre-sputtering said element in said sputtering device, and forming an ITO film to a thickness in the range of 500 Å to 5000 Å.

* * * * *